United States Patent
Teboulle et al.

(10) Patent No.: US 11,137,427 B2
(45) Date of Patent: Oct. 5, 2021

(54) METHOD FOR VERIFYING THE WIRING OF A METER

(71) Applicant: SAGEMCOM ENERGY & TELECOM SAS, Rueil-Malmaison (FR)

(72) Inventors: Henri Teboulle, Rueil-Malmaison (FR); Paolo Moro, Rueil-Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 175 days.

(21) Appl. No.: 16/487,046

(22) PCT Filed: Jan. 25, 2018

(86) PCT No.: PCT/EP2018/051893
§ 371 (c)(1),
(2) Date: Aug. 19, 2019

(87) PCT Pub. No.: WO2018/149614
PCT Pub. Date: Aug. 23, 2018

(65) Prior Publication Data
US 2020/0011910 A1 Jan. 9, 2020

(30) Foreign Application Priority Data
Feb. 20, 2017 (FR) .................... 17 51339

(51) Int. Cl.
*G01R 22/06* (2006.01)
*G01R 25/00* (2006.01)

(52) U.S. Cl.
CPC .......... *G01R 22/068* (2013.01); *G01R 25/00* (2013.01)

(58) Field of Classification Search
CPC ..... G01R 22/068; G01R 25/00; G01R 22/066
(Continued)

(56) References Cited

U.S. PATENT DOCUMENTS

| 5,966,010 A * | 10/1999 | Loy .................. G01R 11/04 324/127 |
| 7,274,305 B1 * | 9/2007 | Luttrell ................ B61L 1/20 324/141 |

(Continued)

FOREIGN PATENT DOCUMENTS

FR 2 947 055 A1 12/2010
WO WO 2014/053302 A1 4/2014

*Primary Examiner* — Christopher P McAndrew
*Assistant Examiner* — Zannatul Ferdous
(74) *Attorney, Agent, or Firm* — Muncy, Geissler, Olds & Lowe, P.C.

(57) ABSTRACT

A method for verifying the wiring of an electrical energy meter, the meter comprising an upstream phase terminal, a downstream phase terminal and a cut-off member mounted between the upstream phase terminal and the downstream phase terminal, the verification method comprising the steps of: opening the cut-off member; measuring an upstream phase voltage upstream from the cut-off member and a downstream phase voltage downstream from the cut-off member; detecting, particularly according to a measurement of the upstream phase voltage and a measurement of the downstream phase voltage, a possible wiring error; if a wiring error is detected, generating and alert; if no wiring error is detected, closing the cut-off member and putting the meter in a nominal operating mode.

19 Claims, 4 Drawing Sheets

(58) Field of Classification Search
USPC .................................................. 324/110–142
See application file for complete search history.

(56) References Cited

U.S. PATENT DOCUMENTS

| | | | | |
|---|---|---|---|---|
| 2003/0086074 A1* | 5/2003 | Braig | ............... | A61B 5/150503 |
| | | | | 356/39 |
| 2009/0261805 A1* | 10/2009 | Shuey | .................. | G01R 21/133 |
| | | | | 324/76.11 |
| 2010/0036624 A1* | 2/2010 | Martin | .................... | G01R 22/10 |
| | | | | 702/61 |
| 2012/0010831 A1* | 1/2012 | Kagan | .................... | G01D 4/004 |
| | | | | 702/60 |
| 2018/0006461 A1* | 1/2018 | She | ....................... | H02J 3/1842 |

* cited by examiner

METHOD FOR VERIFYING THE WIRING OF A METER

The invention relates to the field of methods of verifying the wiring of a meter that is to measure electricity consumption.

BACKGROUND OF THE INVENTION

Installing an electricity meter consists in particular in connecting the meter to the electricity distribution network and to an electrical installation for which the meter measures the consumption of electrical energy.

It can happen that an installer in charge of installing the meter makes a wiring error when installing the meter.

By way of example, a wiring error may consist in connecting a phase of the network to a downstream phase terminal of the meter (i.e. a client-side terminal) instead of to an upstream phase terminal of the meter (i.e. a network-side terminal), or indeed connecting a network neutral to an upstream phase terminal or to a downstream phase terminal of the meter.

Such a wiring error can give rise to serious malfunctioning of the network, of the electrical installation, or of the meter, and might even lead to a fire.

In order to protect an electrical installation from a large short circuit current resulting from such a wiring error, it is known to make use of a protective circuit breaker.

In particular, a protective circuit breaker is known that comprises a stationary contact, a movable contact, and a switch electrode situated in the proximity of the stationary contact and of the movable contact, together with a shunt circuit. The switch electrode picks up an electric arc that is struck by separating the movable contact from the stationary contact when a short circuit occurs. Transferring the electric arc onto the switch electrode closes the shunt circuit. A large portion of the short circuit current is thus diverted into the shunt circuit, thereby protecting the electrical installation.

That type of solution requires one or more circuit breakers of the kind described above to be used. That type of solution therefore presents a certain amount of cost and makes the electrical installation more complicated.

OBJECT OF THE INVENTION

An object of the invention is to provide a simple and inexpensive solution for protecting an electricity network, an electrical installation, or a meter from the effects of an error in wiring the meter.

SUMMARY OF THE INVENTION

In order to achieve this object, there is provided a verification method for verifying the wiring of a meter for measuring the consumption of electricity supplied by a network to an electrical installation, the meter having an upstream phase terminal, a downstream phase terminal, and a cutoff member connected between the upstream phase terminal and the downstream phase terminal, the verification method comprising the following steps:

opening the cutoff member;

measuring the upstream phase voltage upstream from the cutoff member and measuring the downstream phase voltage downstream from the cutoff member;

detecting a potential wiring error, in particular as a function of a measurement of the upstream phase voltage and a measurement of the downstream phase voltage;

if a wiring error is detected, generating a warning;

if no wiring error is detected, closing the cutoff member and putting the meter into a nominal mode of operation.

The meter thus generates a warning when a wiring error is detected and it holds the cutoff member open, thereby enabling the wiring error to be corrected and avoiding any risk of damaging the network, the electrical installation, or the meter.

The upstream phase voltage and the downstream phase voltage may be measured by using pre-existing voltage sensors, and the method of the invention for verifying the wiring of a meter is thus simple and inexpensive to implement.

There is also provided a method of installing a meter for measuring the consumption of electricity supplied by a network to an electrical installation, the meter being positioned downstream from a disconnector and having an upstream phase terminal, a downstream phase terminal, and a cutoff member connected between the upstream phase terminal and the downstream phase terminal, the installation method comprising the steps of:

opening the disconnector and the cutoff member;

wiring the meter;

reclosing the disconnector;

causing the meter to perform the verification method as described above.

There is also provided a meter for measuring electricity supplied by a network to an electrical installation, the meter comprising an upstream phase terminal, a downstream phase terminal, and a cutoff member connected between the upstream phase terminal and the downstream phase terminal, the meter including an upstream voltage sensor arranged to measure an upstream phase voltage upstream from the cutoff member, a downstream voltage sensor arranged to measure a downstream phase voltage downstream from the cutoff member, and processor means arranged to detect a wiring error, in particular as a function of a measurement of the upstream phase voltage and a measurement of the downstream phase voltage, the processor means also being arranged to generate a warning if a wiring error is detected, and to close the cutoff member and put the electricity meter into a nominal mode of operation if no wiring error is detected.

There is also provided a computer program including instructions for enabling an electricity meter to perform the verification method as described above.

There are also provided storage means, storing a computer program including instructions for enabling an electricity meter to perform the verification method as described above.

Other characteristics and advantages of the invention appear on reading the following description of particular, non-limiting implementations of the invention.

BRIEF DESCRIPTION OF THE DRAWINGS

Reference is made to the accompanying drawings, in which.

DETAILED DESCRIPTION OF THE INVENTION

Figure 1:
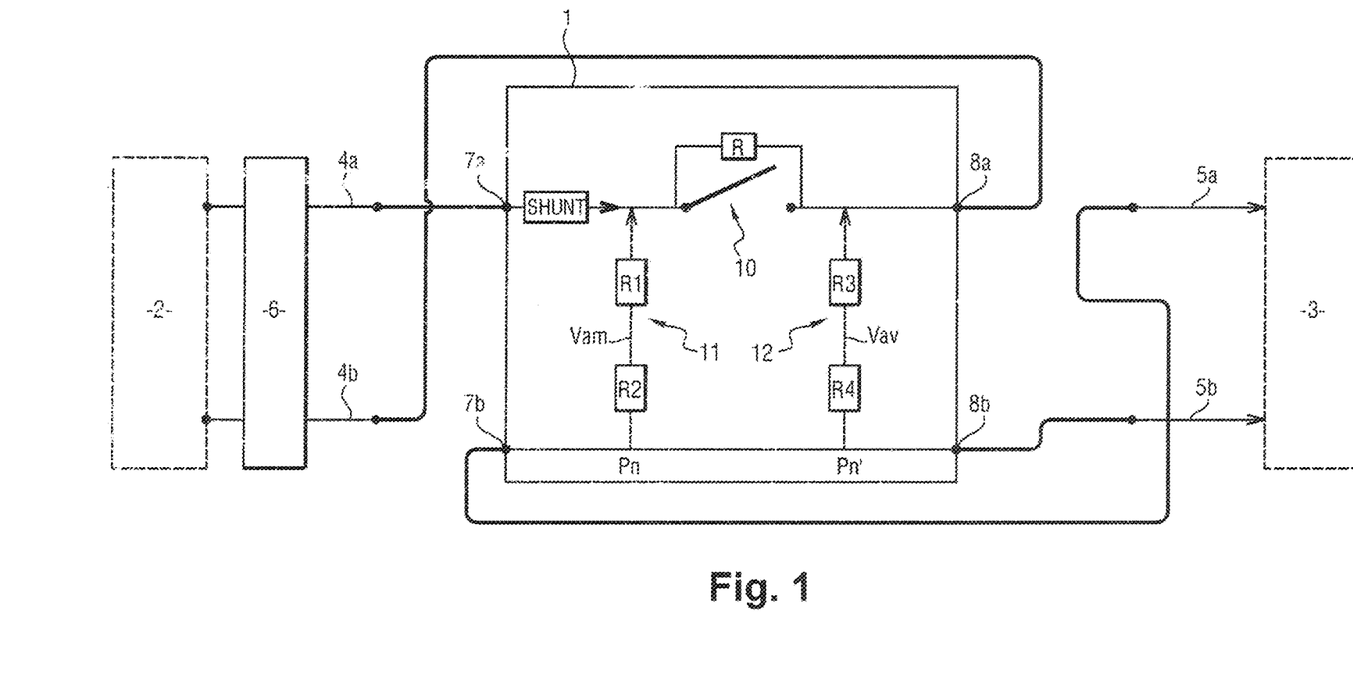
FIG. 1 shows a single-phase meter in which the method of a first implementation of the invention is implemented for verifying the wiring of a meter.

With reference to FIG. 1, the method in a first implementation of the invention for verifying the wiring of a meter is implemented on a single-phase meter 1.

The meter 1 is for measuring the consumption of electrical energy supplied by an electricity distribution network 2 to an electrical installation 3. The network has a phase conductor 4a and a neutral conductor 4b. The voltage of the network 2 is an alternating current (AC) voltage at a frequency of 50 hertz (Hz) with a root mean square (rms) value of 230 volts (V). The installation 3 receives electricity via a phase conductor 5a and a neutral conductor 5b.

A disconnector 6 is located on the same side as the network 2 in order to be able to isolate the network 2 from the installation 3, whenever that is necessary.

The meter 1 has an upstream phase terminal 7a, a downstream phase terminal 8a, an upstream neutral terminal 7b, and a downstream neutral terminal 8b.

The upstream phase terminal 7a is for connecting to the phase conductor 4a of the network 2. The downstream phase terminal 8a is for connecting to the phase conductor 5a of the installation 3. The upstream neutral terminal 7b is for connecting to the neutral conductor 4b of the network 2. The downstream neutral terminal 8b is for connecting to the neutral conductor 5b of the installation 3.

The meter 1 also has a cutoff member 10 connected between the upstream phase terminal 7a and the downstream phase terminal 8a. The cutoff member 10 makes it possible, remotely, to act selectively to connect the installation 3 to the network 2, and to disconnect it therefrom.

The meter 1 also has an upstream phase voltage sensor 11 and a downstream phase voltage sensor 12.

The upstream phase voltage Vam is a voltage in the meter 1 upstream from the cutoff member 10. The upstream phase voltage Vam in this example is equal to a potential difference between a point upstream from the cutoff member 10 and a neutral point Pn.

The downstream phase voltage Vav is a voltage in the meter 1 downstream from the cutoff member 10. In this example, the downstream phase voltage Vav is equal to a potential difference between a point downstream from the cutoff member 10 and a neutral point P'n at the same potential as the neutral point Pn.

In a single-phase meter 1, it should be observed that neutral is floating. The potential of the neutral points Pn and P'n is therefore different from a potential close to ground potential.

The upstream voltage sensor 11 and the downstream voltage sensor 12 are each symbolized by two resistors, but in reality they could be much more complicated.

The meter 1 also has processor means (not shown) comprising an intelligent processor component (e.g. a processor, a microcontroller, or a field programmable gate array (FPGA)) suitable for executing instructions of a program for performing the method in the first implementation of the invention for verifying the wiring of a meter. The intelligent processor component performs other functions, and in particular it is adapted to manage the operation of the meter, to control the cutoff member, to acquire and process measurements taken by the voltage sensors, etc.

The meter 1 naturally has other elements that are not described herein, and in particular means for measuring the electricity consumption of the installation 3.

Figure 2:
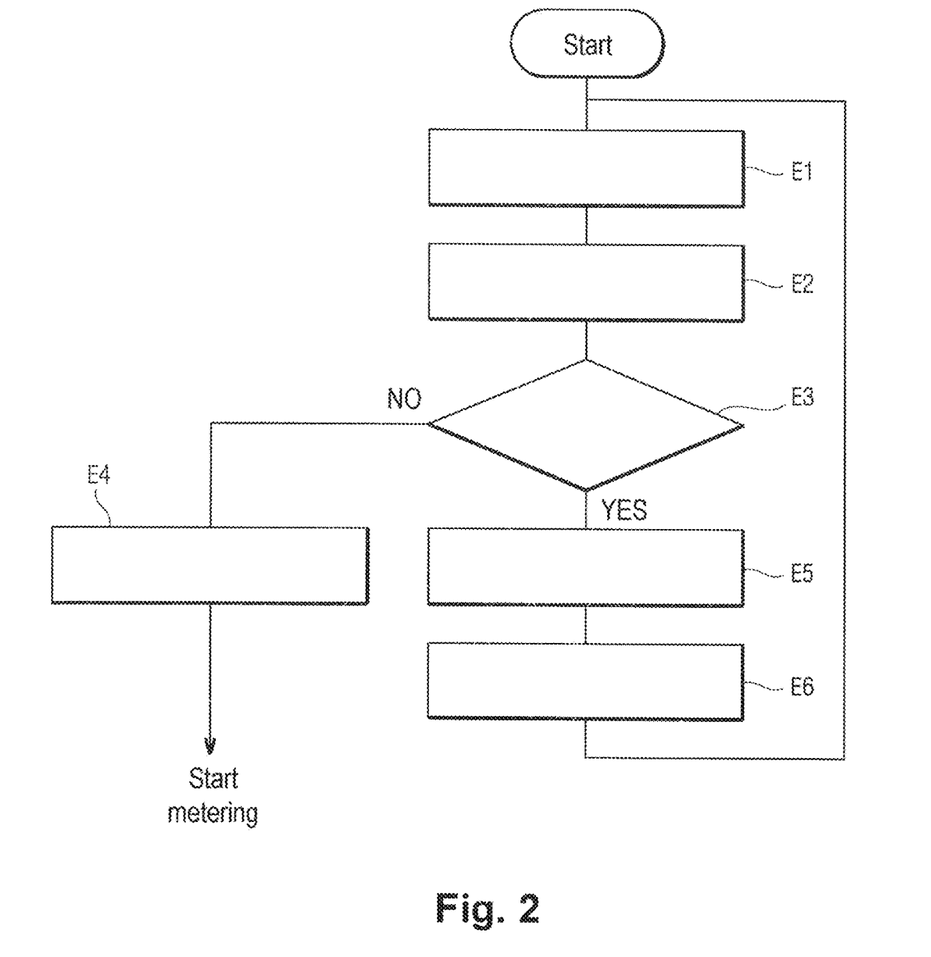
FIG. 2 shows the steps of the method in the first implementation of the invention for verifying the wiring of a meter.

With reference to FIG. 2, there follows a description of the steps of installing the meter 1 and of the method in the first implementation of the invention for verifying the wiring of a meter.

The meter 1 is installed by an installer.

When beginning the installation, the disconnector 6 and the cutoff member 10 are both open.

The cutoff member 10 is opened in the factory once the meter 1 has been manufactured, or else it is opened by the processor means of the meter 1 when starting the meter 1.

The installer installs the meter 1 at the intended location, and then connects the meter 1 to the network 2 and to the installation 3. When the installer has finished wiring the meter 1, the installer closes the disconnector 6 (step E1).

The meter 1 then starts.

The voltage sensors 11 and 12 measure the upstream phase voltage Vam and the downstream phase voltage Vav.

The processor means acquire the measurements of the upstream phase voltage Vam and of the downstream phase voltage Vav_and they measure a first phase difference φ1 between the upstream phase voltage Vam and the downstream phase voltage Vav. The phase difference φ1 is measured using a "zero crossing" type method (step E2). All of the phase differences in this document are expressed in degrees and they lie in the range [0°, 360°].

If the wiring has been done properly, the upstream phase voltage Vam (or more exactly the rms value of the upstream phase voltage Vam) should be close to 230 V, and the downstream phase voltage Vav (or more exactly the rms value of the downstream phase voltage Vav) should be close to 0 V (typically less than 10 V).

Below, the comparisons between various voltages and various voltage thresholds relate to the rms values of the various voltages.

In the event of a wiring error as shown in FIG. 1, where the neutral conductor 4b of the network 2 has been connected to the downstream phase terminal 8a of the meter 1 and where the phase conductor 5a of the installation 3 has been connected to the upstream neutral terminal 7b of the meter 1, this condition is not satisfied.

Under such circumstances (and when the network 2 is not suffering a power failure), since neutral is floating, equilibrium becomes established between the upstream phase voltage Vam and the downstream phase voltage Vav. The upstream phase voltage Vam and the downstream phase voltage Vav_are in phase opposition. The upstream phase voltage Vam and the downstream phase voltage Vav both present an rms value close to half of 230 V, i.e. close to 115 V.

The processor means thus verify the following three conditions (step E3), and they detect a wiring error when all three of the following conditions are satisfied:

the first phase difference φ1 is such that: $180°-x1 \leq \varphi1 \leq 180°+x1$, where x1 is a first predetermined phase threshold lying in the range 1° to 10° (in this example x1 is equal to 5°);

the upstream phase voltage Vam is greater than a predefined voltage threshold;

the downstream phase voltage Vav is greater than the predefined voltage threshold.

In this example, the predefined voltage threshold is selected to be equal to 75 V.

Thus, so long as all three of these conditions are not satisfied, a wiring error is not detected, and the processor means of the meter 1 close the cutoff member 10 (step E4) putting the meter 1 into a nominal mode of operation. The meter 1 then begins to measure the electricity consumption of the installation 3.

However, if these three conditions are true, then the processor means detect the wiring error and produce a warning in order to warn the installer of the error (step E5). The warning is generated by flashing a light-emitting diode (LED) of the meter 1, or by displaying a warning message on a screen of the meter 1. By way of example, the screen of the meter 1 may be a liquid crystal screen.

Once a warning has been produced, the cutoff member 10 is held open by the processor means. The installer opens the disconnector 6 (step E6), disconnects the meter 1, and rewires the meter 1 in order to correct the wiring error.

The installation of the meter then restarts with step E1.

It should be observed that it is also possible to detect another type of wiring error.

When the processor means detect that the upstream phase voltage Vam is close to 0 V and the downstream phase voltage Vav is close to the voltage of the network 2 (230 V), the processor means verify whether the installation 3 is or is not producing electricity.

The processor means verify this condition by verifying that the downstream phase voltage Vav is greater than a first predefined high-voltage threshold and that the upstream phase voltage Vam is less than a first predefined low-voltage threshold.

If the installation 3 is not producing electricity, a wiring error is detected. This wiring error corresponds to the phase conductor 4a of the network 2 being wired to the downstream phase terminal 8a of the meter 1, and the phase conductor 5a of the installation 3 being wired to the upstream phase terminal 7a of the meter 1.

The processor means then produce a warning to warn the installer about the error.

Once a warning is produced, the cutoff member 10 is held open by the processor means. The installer opens the disconnector 6, disconnects the meter 1, and rewires the meter 1 in order to correct the wiring error.

Nevertheless, a situation in which the upstream phase voltage Vam is close to the voltage of the network 2 and in which the downstream phase voltage Vav is close to the voltage of the network 2 can also correspond to an installation 3 that is producing electricity. Under such circumstances, the installation 3 has electricity production means (e.g. solar panels). The client is supplying some or all of the electricity that is produced by the installation 3 to the network 2.

Thus, when the processor means detect that the upstream phase voltage Vam is close to the voltage of the network 2 and the downstream phase voltage Vav is close to the voltage of the network 2, the processor means cannot determine whether this is a wiring error or an installation 3 that is producing electricity.

It should be observed that under such circumstances the measurement of the phase difference φ1 between the upstream phase voltage Vam and the downstream phase voltage Vav, as measured by a "zero crossing" type method, is such that $360°-x2 \leq \varphi1 \leq x2$, where x2 is a second predetermined phase threshold lying in the range 1° to 4° (typically x2=3°), and does not make it possible to determine whether or not there is a wiring error. Specifically, when the installation 3 produces electricity, a coupler of the installation 3 synchronizes the downstream phase voltage Vav with the upstream phase voltage Vam.

This wiring error does not present any fire risk.

Under such circumstances, the processor means generate a message for the electricity supplier or for the manager of the network 2. The message is transmitted by powerline carrier or by any other wired or wireless type of communication means. When a powerline carrier is used, the device language message specification (DLMS) or companion specification for energy metering (COSEM) application layers are advantageously used.

The message summarizes the situation and indicates that the installation 3 appears to be producing electricity. The electricity supplier or the manager of the network 2 then verifies whether the installation 3 is indeed an electricity-producing installation and thus whether this situation is normal or not. If the situation is abnormal, the electricity supplier or the manager of the network 2 sends a new installer to the meter 1 in order to correct the wiring error.

Figure 3:
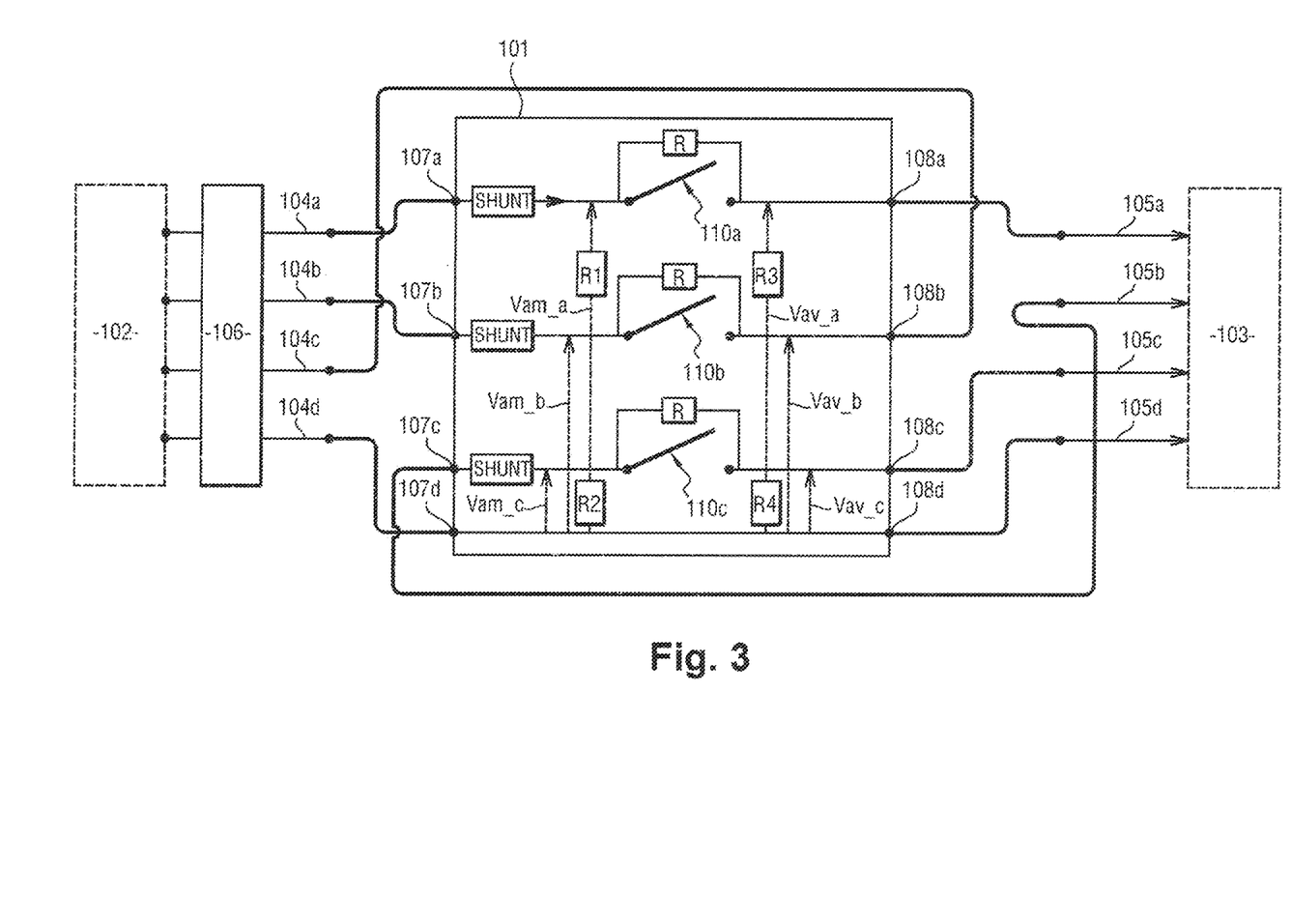
FIG. 3 shows a three-phase meter in which a second implementation of the invention is implemented for verifying the wiring of a meter.

With reference to FIG. 3, the method in a second implementation of the invention for verifying the wiring of a meter is performed on a three-phase meter 101.

The network 102 has three phase conductors 104a, 104b, and 104c together with a neutral conductor 104d. The voltage of the network 102 is an AC voltage of frequency equal to 50 Hz with an rms value of 230 V. The installation 103 receives electricity on three phase conductors 105a, 105b, and 105c, together with a neutral conductor 105d.

A disconnector 106 is positioned beside the network 102 in order to enable the installation 103 to be isolated from the network 102, whenever that is necessary.

The meter 101 has three upstream phase terminals 107a, 107b, and 107c, three downstream phase terminals 108a, 108b, and 108c, an upstream neutral terminal 107d, and a downstream neutral terminal 108d.

The meter 101 also has a cutoff member 110a, 110b, and 110c connected between each upstream phase terminal 107 and the corresponding downstream phase terminal 108.

The meter 101 also has upstream phase voltage sensors and downstream phase voltage sensors. The upstream phase voltage sensors measure the upstream voltages Vam_a, Vam_b, and Vam_c. The downstream voltage sensors measure the downstream voltages Vav_a, Vav_b, and Vav_C.

Figure 4:
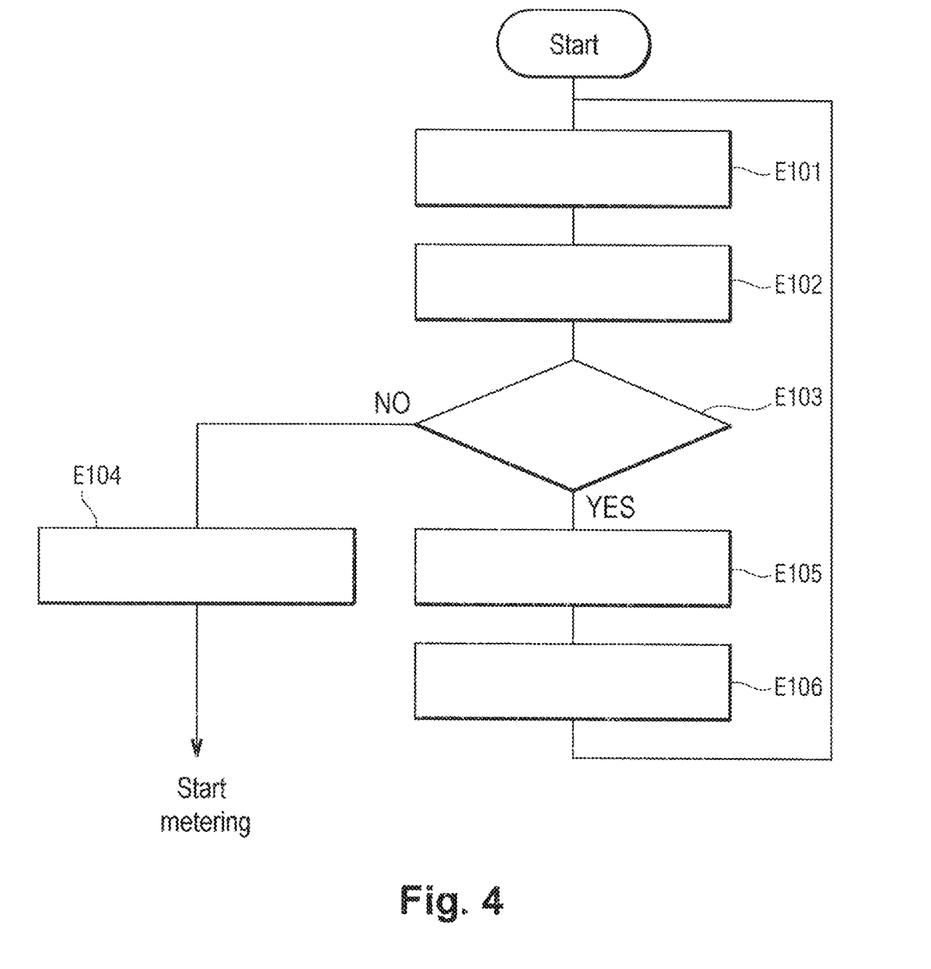
FIG. 4 shows the steps of the method in the second implementation of the invention for verifying the wiring of a meter.

With reference to FIG. 4, there follows a description of the steps of installing the meter 101 and of the method in the second implementation of the invention for verifying the wiring of a meter.

The meter 101 is installed by an installer.

When installation begins, the disconnector 106 and the cutoff members 110 are opened. When the installer has finished wiring the meter 101, the disconnector 106 is reclosed. The meter then starts (step E101). The cutoff members 110 are opened in the factory once the meter 101 has been manufactured, or else they are opened by the processor means of the meter 101 as soon as the meter 101 is started.

The voltage sensors measure the upstream phase voltages Vam_a, Vam_b, and Vam_c and the downstream phase voltages Vav_a, Vav_b, and Vav_c (step E102).

If the wiring has been done correctly, each upstream phase voltage Vam should be close to the voltage of the network, i.e. 230 V, and each downstream phase voltage Vav should be close to 0 V.

In the event of a wiring error as shown in FIG. 3, where the phase conductor 104c of the network 102 has been connected to the downstream phase terminal 108b of the meter 101 and where the phase conductor 105b of the installation 103 has been connected to the upstream phase terminal 107c of the meter 101, the upstream phase voltage Vam_c is on the contrary close to 0 V and the downstream phase voltage Vav_b is on the contrary close to 230 V.

The processor means detect the wiring error when one of the upstream phase voltages Vam is less than a second predefined low-voltage threshold and when one of the downstream phase voltages Vav is greater than a second predefined high-voltage threshold.

The processor means thus verify this condition (step E103).

In this example, the second predefined low-voltage threshold is equal to 10 V and the second predefined high-voltage threshold is equal to 176 V.

If this condition is not satisfied, a wiring error is not detected, and the processor means of the meter 101 close the cutoff members 110 and put the meter 101 into a nominal mode of operation (step E104). The meter 101 begins to measure the electricity consumption of the installation 103.

In contrast, if this condition is satisfied, the processor means detect the wiring error and produce a warning in order to warn the installer of the error (step E105).

As soon as a warning is produced, the cutoff members 110 are held open by the processor means. The installer opens the disconnector 106, disconnects the meter 101 and rewires the meter 101 in order to correct the wiring error (step E106).

If it is considered that the installation 103 might produce electricity, it can happen that there is a downstream phase voltage Vav that is greater than the second predefined high-voltage threshold, e.g. the downstream phase voltage Vav_b, even though no wiring error has been made.

Under such circumstances, the processor means also measure a second phase difference φ2 between the downstream phase voltage Vav_b and the corresponding upstream phase voltage Vam_b, and a third phase difference φ3 between the downstream phase voltage Vav_b and another upstream phase voltage, e.g. the upstream phase voltage Vav_a.

The processor means verify that the phase differences φ2 and φ3 are indeed such that:

$$120°-x3 \leq \varphi 2 \leq 120°+x3 \text{ or } 240°-x3 \leq \varphi 2 \leq 240°+x3,$$

and $$240°-x3 \leq \varphi 3 \leq 240°+x3 \text{ or } 120°-x3 \leq \varphi 3 \leq 120°+x3,$$

where x3 is a third predetermined phase threshold lying in the range 1° to 10° (in this example x3 is equal to 2°).

The phase differences φ2 and φ3 are measured using a "zero crossing" type method.

The processor means verify that the phase differences φ2 and φ3 are consistent relative to the order of phase differences while the installation 103 is producing electricity (the downstream phase voltage Vav_b and the corresponding upstream phase voltage Vam_b are in-phase).

When, for a given phase, the wiring of the upstream phase terminal 107 and the wiring of the downstream phase terminal 108 has been interchanged, and when the installation 103 does not produce electricity, the processor means determine that the upstream phase voltage Vam is close to 0 V (i.e. less than the second predetermined low-voltage threshold), and that the downstream phase voltage Vav is close to 230 V (i.e. greater than the second predetermined high-voltage threshold).

The processor means produce a warning in order to warn the installer of the error. There is no risk of fire under such circumstances.

The installation of the meter then starts again with step E101.

Nevertheless, if the installation 103 does produce electricity, the upstream phase voltage Vam and the downstream phase voltage Vav will be synchronized and such a wiring error is not detected directly. There is no risk of fire under such circumstances. The wiring error will also not be visible on the phases of the upstream phase voltage Vam and the downstream phase voltage Vav, which are synchronized. Under such circumstances, an upstream phase voltage is measured that is greater than the second predefined high-voltage threshold, and a corresponding downstream phase voltage is measured that is greater than the second predefined high-voltage threshold, and a fourth phase difference φ4 is measured between those two voltages using a "zero crossing" type method, which is such that 360°−x4≤φ4≤x4, where x4 is a fourth predetermined phase threshold lying in the range 1° to 4° (typically x4=3°).

Under such circumstances, the processor means generate a message for the electricity supplier or for the manager of the network 102. This message is transmitted by powerline carrier or by any other (wired or wireless) type of communication means. When powerline carriers are selected, the DLMS or COSEM application layers are advantageously used.

The message summarizes the situation and indicates that the installation 103 would appear to be an electricity-producing installation. The electricity supplier or the manager of the network 102 verifies whether the installation 103 is indeed an electricity-producing installation, and thus whether the situation is normal or not. If the situation is abnormal, the electricity supplier or the manager of the network 102 sends the installer once more to the meter 101 in order to correct the writing error.

Naturally, the invention is not limited to the implementations described but covers any variant coming within the ambit of the invention as defined by the claims.

In the description above, the invention is implemented on a single-phase meter and on a three-phase meter, however the invention applies to any polyphase meter regardless of the number of phases.

The invention is illustrated by explaining how certain wiring errors are detected, however the invention can also be used to detect other wiring errors.

The numerical values that are given above, in particular the predefined voltage thresholds and the predefined phase thresholds could naturally be different. Likewise, the invention could equally well be applied with different numerical values for an electricity supply network operating at 60 Hz and 110 V.

The invention claimed is:

1. A verification method for verifying the wiring of a meter for measuring the consumption of electricity supplied by a network to an electrical installation in order to detect proper installation of wiring, the meter having an upstream phase terminal, a downstream phase terminal, and a cutoff member connected between the upstream phase terminal and the downstream phase terminal, the verification method comprising the following steps:
    opening the cutoff member;
    measuring an upstream phase voltage upstream from the cutoff member and measuring a downstream phase voltage downstream from the cutoff member;
    detecting a potential wiring installation error, in particular as a function of a measurement of the upstream phase voltage and a measurement of the downstream phase voltage;

if a wiring installation error is detected, generating a warning;

if no wiring installation error is detected, closing the cutoff member and putting the meter into a nominal mode of operation.

2. The verification method according to claim 1, wherein the meter is a single-phase meter and wherein the wiring installation error is also detected as a function of a measurement of a first phase difference between the upstream phase voltage and the downstream phase voltage.

3. The verification method according to claim 2, wherein the wiring installation error is detected when the following three conditions are satisfied simultaneously:

the first phase difference ($\varphi 1$) is such that:
$180°-x1 \leq \varphi 1 \leq 180°+x1$, where x1 is a first predetermined phase threshold lying in the range 1° to 10°;

the upstream phase voltage is greater than a predefined voltage threshold;

the downstream phase voltage is greater than the predefined voltage threshold.

4. The verification method according to claim 2, wherein the first phase difference is measured by using a "zero crossing" type method.

5. The verification method according to claim 2, further comprising, if the downstream phase voltage is greater than a first predefined high-voltage threshold and if the upstream phase voltage is less than a first predefined low-voltage threshold, a step that consists in generating a message for verifying whether the electrical installation is or is not an electricity-producing installation.

6. The verification method according to claim 2, further comprising, if the downstream phase voltage is greater than a first predefined high-voltage threshold and if the upstream phase voltage is greater than a first predefined high-voltage threshold, and if the first phase difference ($\varphi 1$) is such that $360°-x2 \; \varphi 1 \leq x2$, where x2 is a second predetermined phase threshold lying in the range 1° to 10°, a step that consists in generating a message for verifying whether the electrical installation is or is not an electricity-producing installation.

7. The verification method according to claim 1, wherein the meter is a three-phase meter having three upstream phase terminals, three downstream phase terminals, and a cutoff member connected between each upstream phase terminal and the corresponding downstream phase terminal, and wherein the wiring installation error is detected when one of the upstream phase voltages is less than a second predefined low-voltage threshold and when one of the downstream phase voltages is greater than a second predefined high-voltage threshold.

8. The verification method according to claim 7, further comprising, if one of the downstream phase voltages is greater than the second predefined high-voltage thresholds, a step consisting in measuring a second phase difference between the downstream phase voltage greater than the second predefined high-voltage threshold and the corresponding upstream phase voltage, and in measuring a third phase difference between the downstream phase voltage greater than the second predefined high-voltage threshold and another upstream phase voltage.

9. The verification method according to claim 8, further comprising a step consisting in verifying that the second phase difference ($\varphi 2$) and the third phase difference ($\varphi 3$) are such that:

$120°-x3 \leq \varphi 2 \leq 120°+x3$ or $240°-x3 \leq \varphi 2 \leq 240°+x3$ and $240°-x3 \leq \varphi 3 \leq 240°+x3$ or $120°-x3 \leq \varphi 3 \leq 120°+x3$, where x3 is a third predetermined phase threshold lying in the range 1° to 10°.

10. The verification method according to claim 8, wherein the second phase difference and the third phase difference are measured by using a "zero crossing" type method.

11. The verification method according to claim 7, further comprising, if an upstream phase voltage is less than the second predefined low-voltage threshold and if the corresponding downstream phase voltage is greater than the second predefined high-voltage threshold, a step consisting in generating a message to verify whether the electrical installation is or is not an electricity-producing installation.

12. The verification method according to claim 7, further comprising, if an upstream phase voltage is greater than the second predefined high-voltage threshold and if the corresponding downstream phase voltage is greater than the second predefined high-voltage threshold, and if a fourth phase difference ($\varphi 4$) between these two voltages is such that $360°-x4 \leq \varphi 4 \leq x4$, where x4 is a fourth predetermined phase threshold lying in the range 1° to 10°, a step consisting in generating a message to verify whether the electrical installation is or is not an electricity-producing installation.

13. The verification method according to claim 1, wherein the warning informs an installer of the meter that the wiring installation error has been detected.

14. The verification method according to claim 13, wherein the warning is generated by a light-emitting diode of the meter.

15. The verification method according to claim 13, wherein the warning is generated by displaying a warning message on a screen of the meter.

16. A method of installing a meter for measuring the consumption of electricity supplied by a network to an electrical installation, the meter being positioned downstream from a disconnector and having an upstream phase terminal, a downstream phase terminal, and a cutoff member connected between the upstream phase terminal and the downstream phase terminal, the installation method comprising the steps of:

opening the disconnector;
wiring the meter;
reclosing the disconnector;
causing the meter to perform the verification method according to claim 1.

17. A meter for measuring electricity supplied by a network to an electrical installation in order to detect proper installation of wiring, the meter comprising an upstream phase terminal, a downstream phase terminal, and a cutoff member connected between the upstream phase terminal and the downstream phase terminal, the meter including an upstream voltage sensor arranged to measure an upstream phase voltage upstream from the cutoff member, a downstream voltage sensor arranged to measure a downstream phase voltage downstream from the cutoff member, and processor means arranged to detect a wiring installation error, in particular as a function of a measurement of the upstream phase voltage and a measurement of the downstream phase voltage, the processor means also being arranged to generate a warning if a wiring installation error is detected, and to close the cutoff member and put the electricity meter into a nominal mode of operation if no wiring installation error is detected.

18. The computer program including instructions for enabling an electricity meter to perform the verification method according to claim 1.

19. Storage means, wherein they store a computer program including instructions for enabling an electricity meter to perform the verification method according to claim 1.

\* \* \* \* \*